(12) United States Patent
Chiang et al.

(10) Patent No.: US 8,549,739 B2
(45) Date of Patent: Oct. 8, 2013

(54) METHOD OF MAKING CIRCUIT BOARD MODULE

(75) Inventors: Wen-Chung Chiang, Lujhu Township (TW); Keng-Chung Wu, Lujhu Township (TW); Ying-Chi Hsieh, Lujhu Township (TW); Cheng-Kang Lu, Lujhu Township (TW); Ming-Huang Fu, Lujhu Township (TW)

(73) Assignee: Tong Hsing Electronic Industries, Ltd., Taipei (TW)

( * ) Notice: Subject to any disclaimer, the term of this patent is extended or adjusted under 35 U.S.C. 154(b) by 480 days.

(21) Appl. No.: 12/800,414

(22) Filed: May 13, 2010

(65) Prior Publication Data

US 2010/0288537 A1    Nov. 18, 2010

(30) Foreign Application Priority Data

May 15, 2009  (TW) ............................... 98116189 A (51) Int. Cl.
*H05K 7/20* (2006.01)

(52) U.S. Cl.
USPC .............. 29/830; 174/252; 361/710; 361/711

(58) Field of Classification Search
CPC .................................................. H05K 7/20509
USPC ...................... 29/830; 361/710, 711; 174/252
See application file for complete search history.

(56) References Cited

U.S. PATENT DOCUMENTS 5,981,085 A * 11/1999 Ninomiya et al. ............ 428/614

* cited by examiner

*Primary Examiner* — Livius R Cazan
(74) *Attorney, Agent, or Firm* — Kilpatrick Townsend & Stockton LLP (57) ABSTRACT

A circuit board module includes a circuit board and a heat-dissipating device. The circuit board includes a ceramic substrate, and a circuit pattern formed on a surface of the ceramic substrate. The circuit board is sinter-bonded to a main body of the heat-dissipating device. A method of making the circuit board module is also disclosed.

6 Claims, 7 Drawing Sheets

METHOD OF MAKING CIRCUIT BOARD MODULE

CROSS-REFERENCE TO RELATED APPLICATION

This application claims priority to Taiwanese Application No. 098116189, filed May 15, 2009, the disclosure of which is incorporated herein by reference.

BACKGROUND OF THE INVENTION

1. Field of the Invention

This invention relates to a circuit board module, more particularly to a circuit board module capable of dissipating heat and to a method of making the same.

2. Description of the Related Art

Generally, a conventional high-power electronic element, such as a high-brightness light emitting diode (LED), a concentrator photovoltaic cell, or an insulated gate bipolar transistor (IGBT), generates a great amount of heat when being operated. The high-power electronic element may be damaged when the heat generated by the same is unable to be properly dissipated, thereby requiring a heat sink for rapid heat dissipation.

Figure 1:
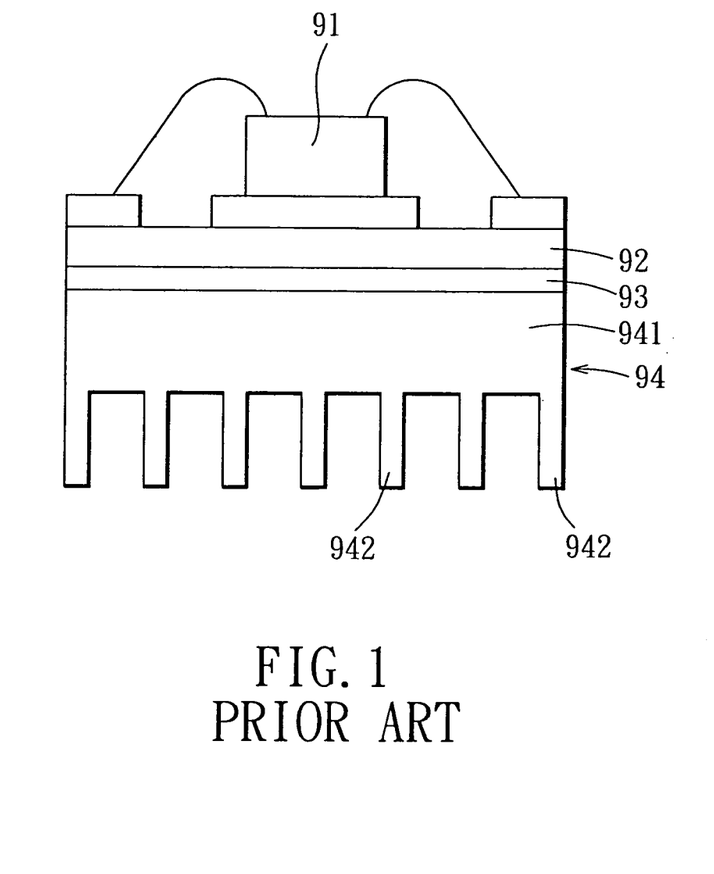
FIG. 1 is a schematic view to illustrate a conventional circuit board module that is used for an electronic element.

Referring to FIG. 1, a conventional circuit board module includes a circuit board 92 and a heat sink 94, and is adapted for supporting an electronic element 91 and dissipating heat from the same. The electronic element 91 is first disposed on the circuit board 92, and the circuit board 92 is subsequently connected to a main body 941 of the heat sink 94 using a thermally conductive adhesive 93 or solder (not shown). Heat produced by the electronic element 91 can be transferred to a plurality of fins 942 of the heat sink 94 through the main body 941 of the heat sink 94, and hence can be rapidly dissipated.

However, thermal resistance of the thermally conductive adhesive 93 (or solder) may influence heat-dissipation efficiency for the electronic element 91. Reduction in the thermal resistance between the electronic element 91 and the heat sink 94 is hence necessary so as to enhance heat-dissipation efficiency. Furthermore, the thermally conductive adhesive 93 (or solder) may rapidly age and degrade in a high-temperature environment such that bonding between the circuit board 92 and the main body 941 of the heat sink 94 may be adversely affected.

SUMMARY OF THE INVENTION

Therefore, the object of the present invention is to provide a circuit board module that can overcome the aforesaid drawbacks of the prior art, and a method of making the same.

According to one aspect of this invention, there is provided a method of making a circuit board module suitable for supporting and dissipating heat from an electronic element. The method comprises: providing a ceramic-copper plate that includes a ceramic substrate and two copper layers formed on two opposite surfaces of the ceramic substrate; patterning one of the copper layers so as to form a copper pattern; providing a heat-dissipating device; providing a positioning unit on a main body of the heat-dissipating device and on the other one of the copper layers; retaining the ceramic-copper plate on the main body of the heat-dissipating device relative to each other through the use of the positioning unit such that the ceramic-copper plate is in contact with the main body of the heat-dissipating device; and conducting a heat treatment so as to bond the ceramic-copper plate to the main body of the heat-dissipating device.

According to another aspect of this invention, there is provided a method of making a circuit board module suitable for supporting and dissipating heat from an electronic element. The method comprises: providing a ceramic-copper plate that includes a ceramic substrate and two copper layers formed on two opposite surfaces of the ceramic substrate; patterning one of the copper layers so as to form a copper pattern; providing a heat-dissipating device; providing an intermediate copper plate; providing a positioning unit on a main body of the heat-dissipating device, the other one of the copper layers, and the intermediate copper plate; retaining the intermediate copperplate between the ceramic-copperplate and the main body of the heat-dissipating device through the use of the positioning unit; and conducting a heat treatment so as to bond the intermediate copper plate to the ceramic-copper plate and the main body of the heat-dissipating device.

According to yet another aspect of this invention, there is provided a circuit board module adapted for supporting and dissipating heat from an electronic element. The circuit board module includes a circuit board, a heat-dissipating device, and an intermediate copperplate. The circuit board includes a ceramic substrate, and a circuit layer that has a circuit pattern and that is formed on a surface of the ceramic substrate. The heat-dissipating device includes a main body. The intermediate copper plate is disposed between and sinter-bonded to the circuit board and the main body of the heat-dissipating device.

According to still another aspect of this invention, there is provided a circuit board module adapted for supporting and dissipating heat from an electronic element. The circuit board module includes a circuit board and a heat-dissipating device. The circuit board includes a ceramic substrate, and a circuit pattern that is formed on a surface of the ceramic substrate. The heat-dissipating device includes a main body. The circuit board is sinter-bonded to the main body of the heat-dissipating device.

BRIEF DESCRIPTION OF THE DRAWINGS

Other features and advantages of the present invention will become apparent in the following detailed description of the preferred embodiments of this invention, with reference to the accompanying drawings, in which.

DETAILED DESCRIPTION OF THE PREFERRED EMBODIMENTS

Before the present invention is described in greater detail, it should be noted that the same reference numerals have been used to denote like elements throughout the specification.

The first preferred embodiment of a method of making a circuit board module suitable for supporting and dissipating heat from an electronic element is described as follows.

Figure 2A:
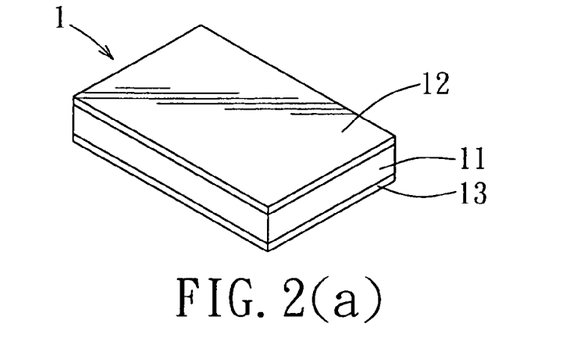
FIGS. 2(a), 2(b), and 2(c) show consecutive steps of making a circuit board of the first preferred embodiment of a circuit board module according to the present invention.

Referring to FIG. 2(a), a ceramic-copper plate 1 is provided, and includes a ceramic substrate 11 and two copper layers 12,13 that are formed on two opposite surfaces of the ceramic substrate 11. The copper layers 12,13 are sinter-bonded to the ceramic substrate 11 using direct copper bonding (DCB). The ceramic-copper plate 1 is commercially available in the market.

Figure 2B:
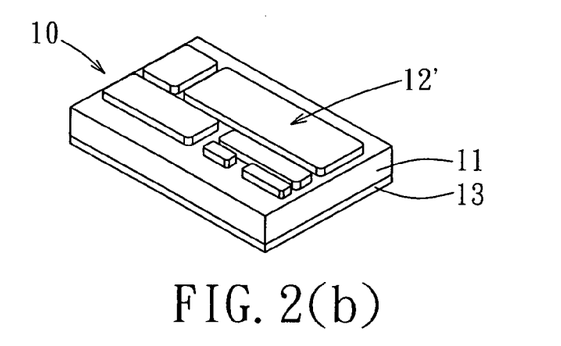
Figure 2C:
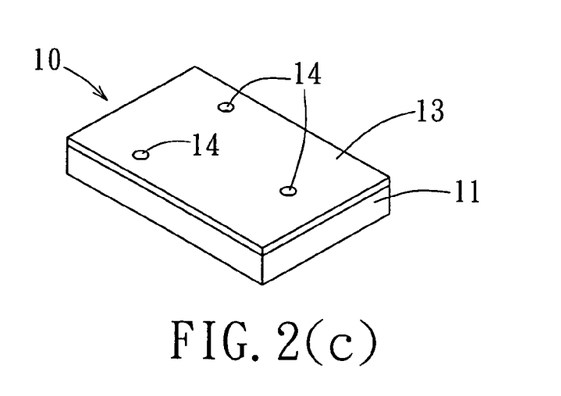

Referring to FIGS. 2(b) and 2(c), the copper layer 12 is patterned so as to form a copper pattern 12' (i.e., a circuit pattern), and the copper layer 13 is patterned so as to form a plurality of first positioning elements 14, thereby forming the circuit board 10. The circuit board 10 shown in FIG. 2(c) is a reverse view of the circuit board 10 shown in FIG. 2(b). The copper layers 12,13 may be patterned through a process frequently used for making a printed circuit board (PCB), such as a photolithography process using a photoresist or a lithography process using printing ink, followed by etching. In this embodiment, the first positioning elements 14 are formed as indentations.

Figure 3:
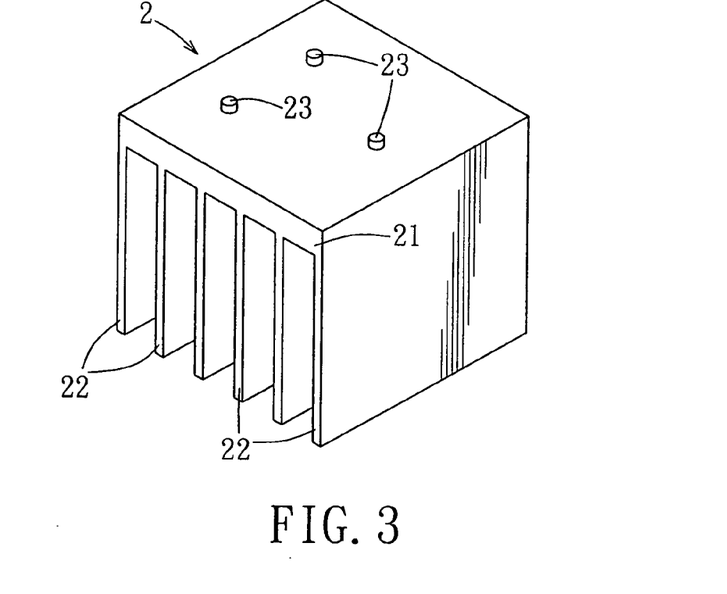
FIG. 3 is a schematic view to illustrate a heat-dissipating device of the first preferred embodiment of the circuit board module.

Referring to FIG. 3, a heat-dissipating device 2 is provided, and includes a main body 21 and a plurality of fins 22 that protrude from the main body 21. A plurality of second positioning elements 23 are formed on the main body 21, and correspond in position to the respective first positioning elements 14 (see FIG. 2(c)). In this embodiment, the second positioning elements 23 are formed as protrusions so as to respectively engage the first positioning elements 14 (i.e., the indentations, see FIG. 2(c)). A cross-section of the protrusions conforms to that of the indentations, and may be circular, square, triangular, etc. A thickness of the protrusions is not larger than a depth of the indentations. Preferably, the thickness of the protrusions is slightly smaller than the depth of the indentations. In this embodiment, the main body 21 and the fins 22 of the heat-dissipating device 2 are made of copper. It should be noted that other types of heat-dissipating devices (e.g., a water-cooled heat-dissipating device and a ceramic heat-dissipating device) are suitable to make the circuit board module of this invention as long as the second positioning elements 23 could be formed thereon.

Figure 4:
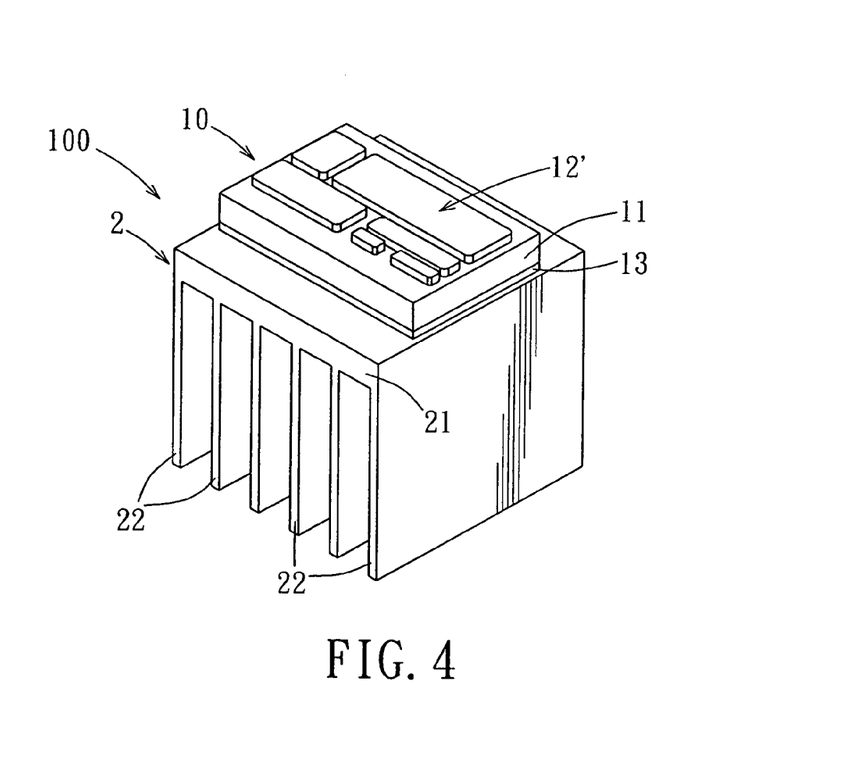
FIG. 4 is a schematic view to illustrate the first preferred embodiment of the circuit board module.

Referring to FIG. 4, the circuit board 10 is retained on the main body 21 of the heat-dissipating device 2 relative to each other through the first and second positioning elements 14,23 such that the circuit board 10 is in contact with the main body 21 of the heat-dissipating device 2. Since the thickness of the protrusions is not larger than the depth of the indentations, a surface of the copper layer 13 of the circuit board 10 is able to contact a surface of the main body 21. At least one of the aforementioned surface of the copper layer 13 and the aforementioned surface of the main body 21 is copper oxide. The assembly of the circuit board 10 and the heat-dissipating device 2 is placed in a furnace having oxygen content less than 10 ppm, and is subjected to a heat treatment using DCB at a temperature that is lower than the melting point of copper (about 1083° C.) and higher than the eutectic temperature of the copper-copper oxide eutectic (1063° C.). The copper layer 13 of the circuit board 10 is sinter-bonded (or eutectic-bonded) to the main body 21, and the circuit board 10 is hence well secured to the main body 21. Accordingly, the first preferred embodiment of a circuit board module 100 according to the present invention is formed, and the circuit board 10 thereof is adapted for supporting an electronic element (not shown).

Figure 5A:
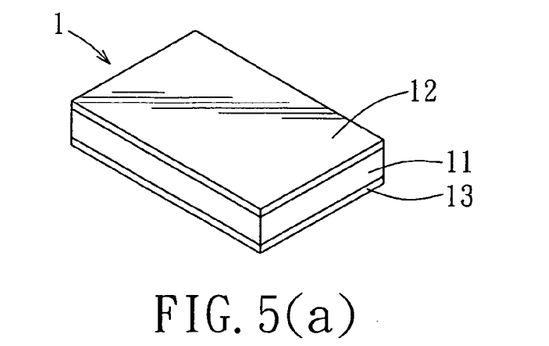
FIGS. 5(a), 5(b), and 5(c) show consecutive steps of making a circuit board of the second preferred embodiment of a circuit board module according to the present invention.
Figure 5B:
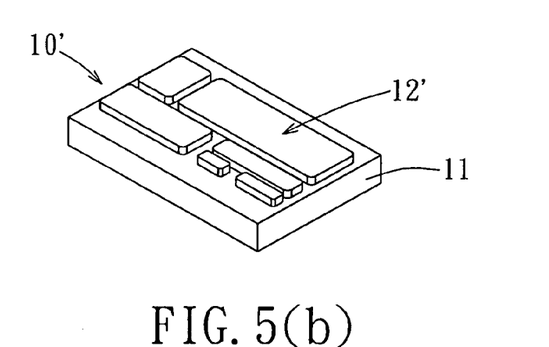
Figure 5C:
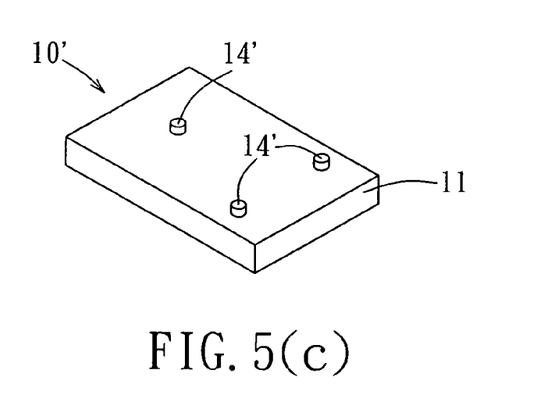

It should be noted that the first positioning elements 14 may be formed as protrusions (see FIG. 5(C)), and the second positioning elements 23 may be formed as indentations (see FIG. 8) so as to engage the first positioning elements 14 in other embodiments. If the first and second positioning elements 14,23 are respectively protrusions and indentations, a surface of the ceramic substrate 11 is sinter-bonded to a surface of the main body 21 of the heat-dissipating device 2. Furthermore, it should be noted that the first and second positioning elements 14,23 may be both formed as indentations in other embodiments. If the first and second positioning elements 14,23 are both formed as indentations, a plurality of pillars (not shown in the figures of this embodiment) are required so that each of the pillars is inserted fittingly in a respective one of the first positioning elements 14 and a respective one of the second positioning elements 23.

In this embodiment, if the main body 21 of the heat-dissipating device 2 is made from a ceramic material, the first positioning elements 14 are preferably formed as indentations. Examples of the ceramic material suitable for the main body 21 of the heat-dissipating device 2 include $Al_2O_3$, AlN, $TiO_2$, $SiO_2$, $ZrO_2$, ZnO, $2MgO.SiO_2$, and $BaTiO_3$. Preferably, the main body 21 of the heat-dissipating device 2 is made from $Al_2O_3$ or AlN.

Figure 7:
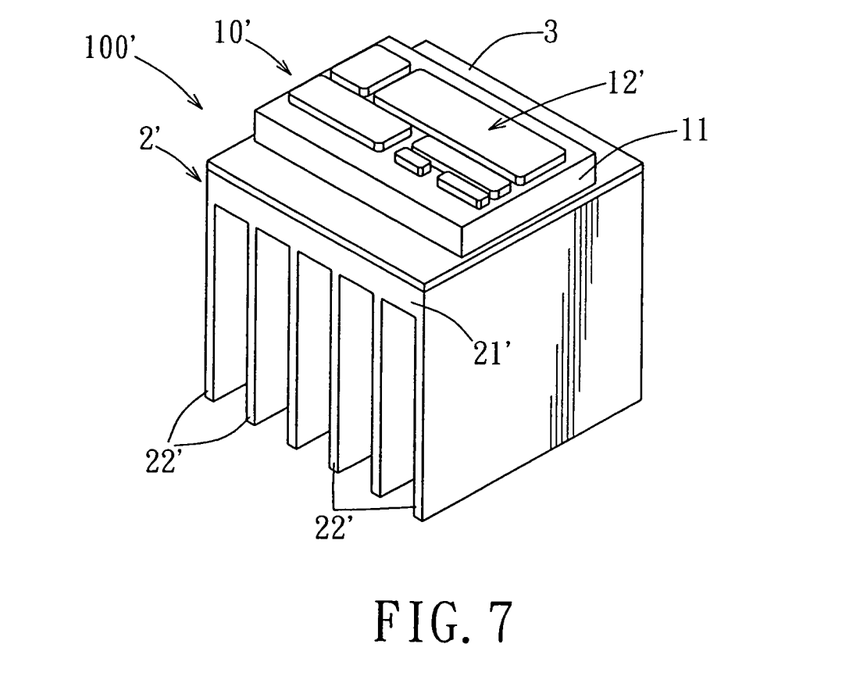
FIG. 7 is a schematic view to illustrate the second preferred embodiment of the circuit board module.

According to the present invention, the second preferred embodiment of the method is described as follows. Referring to FIGS. 5(a)-5(c), the steps of making the circuit board 10' are similar to the steps of making the circuit board 10 shown in FIG. 2(c) except that the first positioning elements 14' are formed as protrusions. The circuit board 10' shown in FIG. 5(c) is a reverse view of the circuit board 10' shown in FIG. 5(b). The heat-dissipating device 2' shown in FIG. 7 is provided, and the second positioning elements 23 formed on the main body 21' of the heat-dissipating device 2' have a structure identical to that of the second positioning elements 23 shown in FIG. 3, i.e., protrusions. Namely, the configuration of the heat-dissipating device 2' shown in FIG. 7 is the same as that of the heat-dissipating device 2 shown in FIG. 3. In this embodiment, the heat-dissipating device 2' is made of a ceramic material (preferably aluminum oxide), and the first positioning elements 14' (see FIG. 5(c)) and the second positioning elements 23 (see FIG. 3) are staggered.

Figure 6:
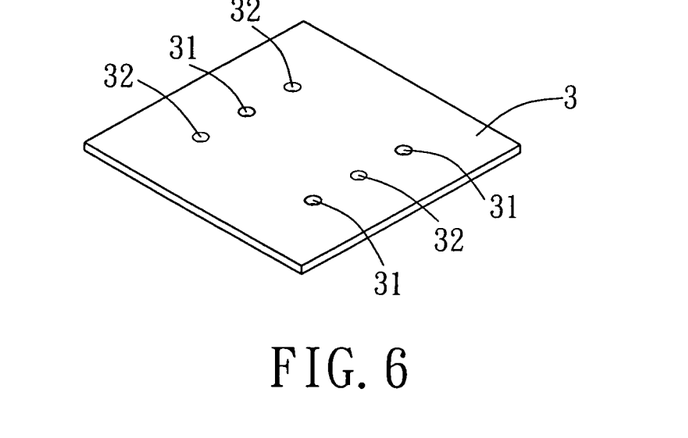
FIG. 6 is a schematic view to illustrate an intermediate copper plate of the second preferred embodiment of the circuit board module.

Referring to FIG. 6, an intermediate copper plate 3 is provided. A plurality of through-holes 31,32 are formed in the intermediate copper plate 3. Each of the through-holes 31 corresponds in position to and accommodates a respective one of the first positioning elements 14', and each of the through-holes 32 corresponds in position to and accommodates a respective one of the second positioning elements 23.

Referring to FIG. 7, the intermediate copper plate 3 is retained between the circuit board 10' and the main body 21' of the heat-dissipating device 2' through the first positioning elements 14' and the second positioning elements 23. The steps of retaining the intermediate copper plate 3 between the circuit board 10' and the main body 21' are described as follows. First, the intermediate copper plate 3 is stacked on the main body 21' so that the second positioning elements 23 engage the through-holes 32. Afterward, the circuit board 10' is stacked on the intermediate copper plate 3 so that the first positioning elements 14' engage the through-holes 31.

Thicknesses of the first and second positioning elements 14',23 are not larger than depths of the through-holes 31,32 (i.e., a thickness of the intermediate copper plate 3). Thus, two opposite surfaces of the intermediate copper plate 3 are able to respectively contact a surface of the main body 21' and a surface of the ceramic substrate 11 of the circuit board 10'. Preferably, the thickness of the intermediate copper plate 3 is slightly larger than the thicknesses of the first and second positioning elements 14',23. The aforementioned two opposite surfaces of the intermediate copper plate 3 are copper oxide. After retaining the intermediate copper plate 3 between the circuit board 10' and the heat-dissipating device 2', the heat treatment as mentioned in the first preferred embodiment of the method is conducted so as to sinter-bond the intermediate copper plate 3 to the circuit board 10' and the main body 21' of the heat-dissipating device 2'. Consequently, the second preferred embodiment of the circuit board module 100' according to the present invention is made.

In this embodiment, the intermediate copper plate 3 has an area which is equal to that of the main body 21'. The intermediate copper plate 3 is capable of rapidly transferring heat in a horizontal direction (i.e., X-Y direction), thereby being able to quickly transfer heat from an electronic element to all surfaces of the main body 21'. Subsequently, the main body 21' can vertically transfer the heat to the fins 22', and the fins 22' are able to dissipate the heat.

Figure 8:
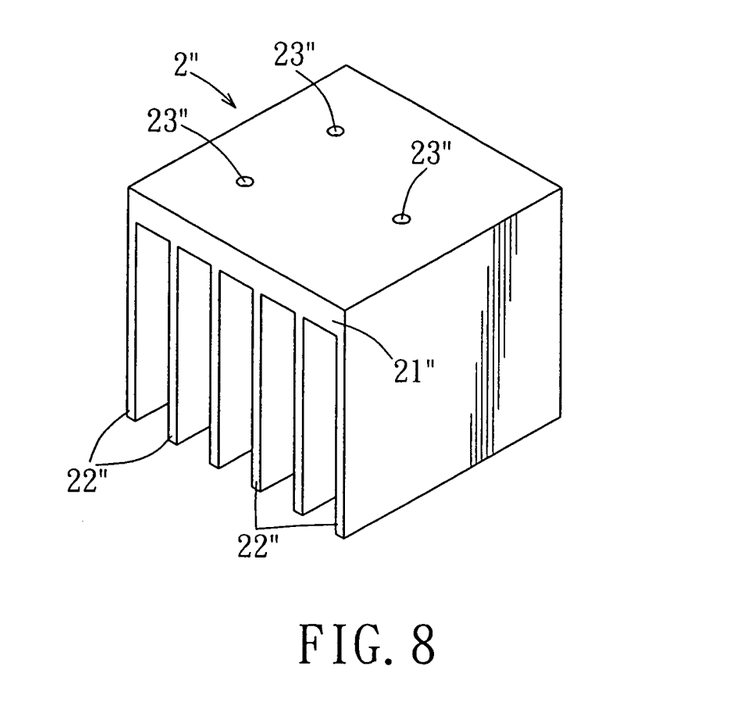
FIG. 8 is a schematic view to illustrate a heat-dissipating device of the third preferred embodiment of a circuit board module according to the present invention.
Figure 9:
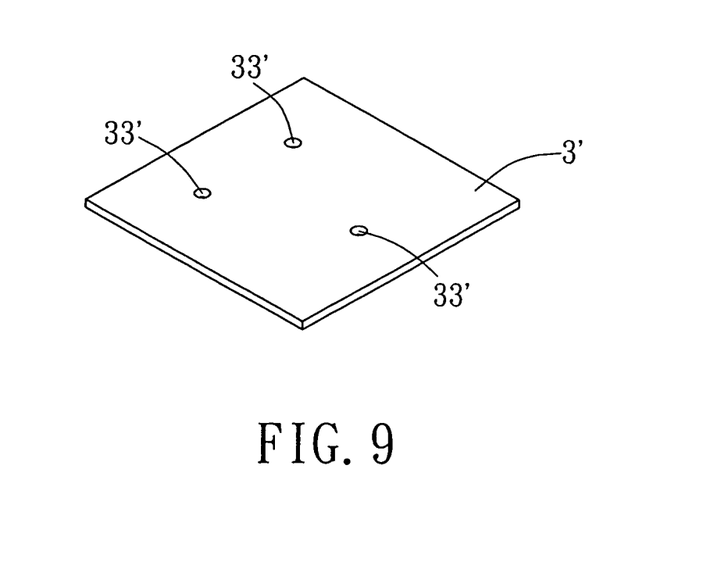
FIG. 9 is a schematic view to illustrate an intermediate copper plate of the third preferred embodiment of the circuit board module.
Figure 10:
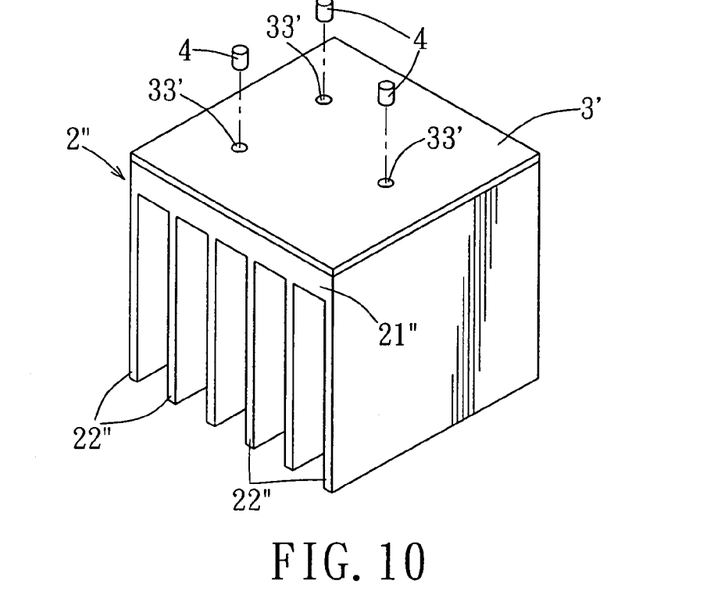
FIG. 10 is a schematic view to illustrate a plurality of pillars of the third preferred embodiment of the circuit board module, which are used to secure the intermediate copperplate shown in FIG. 9 and the heat-dissipating device shown in FIG. 8.

According to the present invention, the third preferred embodiment of the method is described as follows. The steps of making the circuit board 10 (see FIG. 11) in this embodiment of the method are the same as the steps of making the circuit board 10 (see FIG. 2(c)) in the first preferred embodiment of the method. Therefore, the first positioning elements 14 are formed as first indentations. Referring to FIG. 8, the heat-dissipating device 2" is provided. The second positioning elements 23" are formed as second indentations on the main body 21" of the heat-dissipating device 2". Referring to FIG. 9, the intermediate copper plate 3' is provided, and the through-holes 33' are formed therein. Each of the through-holes 33' corresponds in position to a respective one of the first indentations and a respective one of the second indentations. Referring to FIG. 10, a plurality of pillars 4 are provided. Each of the pillars 4 is inserted fittingly into the respective one of the first indentations, the respective one of the second indentations, and the respective one of the through-holes 33'. In this embodiment, the pillars 4 are made of copper. It should be noted that the pillars 4 might be made of ceramic in other embodiments. The heat-dissipating device 2" in this embodiment is made of a ceramic material (preferably aluminum oxide).

Figure 11:
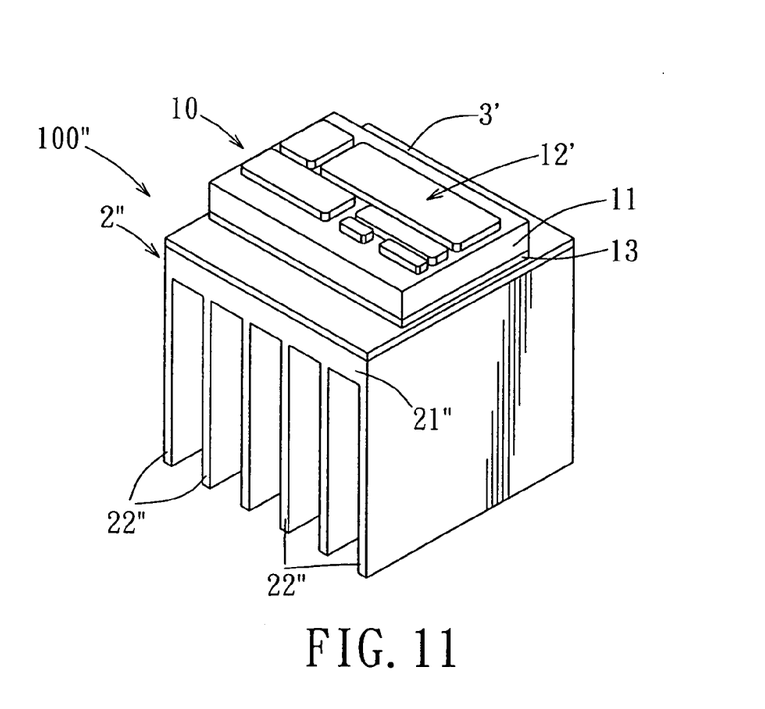
FIG. 11 is a schematic view to illustrate the third preferred embodiment of the circuit board module.

Referring to FIG. 11, the intermediate copper plate 3' is retained between the circuit board 10 and the main body 21" of the heat-dissipating device 2". The steps of retaining the intermediate copper plate 3' between the circuit board 10 and the main body 21" are as follows. First, the intermediate copper plate 3' is stacked on the main body 21" so that each of the through-holes 33' is registered with the respective one of the second indentations (see FIG. 10). Each of the pillars 4 is inserted into a respective pair of the through holes 33' and the second indentations (see FIG. 10). Afterward, the circuit board 10 is stacked on the intermediate copper plate 3' so that the remaining part of each of the pillars 4 is inserted into the respective one of the first indentations. Two opposite surfaces of the intermediate copper plate 3' are able to respectively contact the copper layer 13 of the circuit board 10 and the main body 21" of the heat-dissipating device 2". The heat treatment as mentioned in the first preferred embodiment of the method is conducted so as to sinter-bond the intermediate copper plate 3' to the circuit board 10 and the main body 21' of the heat-dissipating device 2". Therefore, the third preferred embodiment of the circuit board module 100" according to the present invention is made. The intermediate copper plate 3' of the third preferred embodiment of the circuit board module 100" is also able to rapidly transfer heat in the horizontal direction like the intermediate copper plate 3 of the second preferred embodiment of the circuit board module 100' (see FIG. 7).

It should be noted that the second and third preferred embodiments of the method are preferably applied to make a circuit board module having a ceramic heat-dissipating device since the disadvantage of the ceramic material of the heat-dissipating device, i.e., poor heat conduction in a horizontal direction, can be compensated by an intermediate copper plate.

By virtue of the first positioning elements 14,14', the second positioning elements 23,23", the pillars 4, and the through-holes 31,32,33' of the intermediate copper plate 3,3', the circuit board 10,10' can be securely maintained on the main body 21,21',21" during the heat treatment, thereby increasing the production yield.

The ceramic substrate 11 of the circuit board module 100, 100',100" serves as an electrical insulating layer, and is well secured to the main body 21,21',21" via sinter-bonding. Since no thermally conductive adhesives and solder is used, thermal resistance between an electronic element and the heat-dissipating device 2,2',2" is avoided. Thus, the circuit board module 100,100',100" of this invention has better heat-dissipation efficiency compared to the conventional circuit board module shown in FIG. 1.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. A method of making a circuit board module suitable for supporting and dissipating heat from an electronic element, comprising:

providing a ceramic-copper plate that includes a ceramic substrate and two copper layers formed on two opposite surfaces of the ceramic substrate;

patterning one of the copper layers so as to form a copper pattern;

providing a heat-dissipating device;

providing an intermediate copper plate;

providing a positioning unit on a main body of the heat-dissipating device, the other one of the copper layers, and the intermediate copper plate;

retaining the intermediate copper plate between the ceramic-copper plate and the main body of the heat-dissipating device through the use of the positioning unit; and conducting a heat treatment so as to bond the intermediate copper plate to the ceramic-copper plate and the main body of the heat-dissipating device;

wherein the positioning unit includes first positioning elements formed as protrusions on the other one of the copper layers, second positioning elements formed as protrusions on the main body of the heat-dissipating device, and through-holes formed in the intermediate copper plate, each of the through-holes engaging one of the first and second positioning elements.

2. The method of claim 1, wherein the main body of the heat-dissipating device is made of ceramic.

3. The method of claim 1, wherein the main body and second positioning elements of the heat-dissipating device are formed together by molding.

4. The method of claim 1, wherein the second positioning elements of the heat-dissipating device are formed on the main body of the heat-dissipating device, which is preformed.

5. The method of claim 1, wherein the other one of the copper layers is patterned through a photolithography process using a photoresist, followed by etching, so as to form the first positioning elements of the positioning unit.

6. The method of claim 1, wherein the other one of the copper layers is patterned through a lithography process using printing ink, followed by etching, so as to form the first positioning elements of the positioning unit.

* * * * *